United States Patent [19]

Yoshimura et al.

[11] Patent Number: 5,059,850
[45] Date of Patent: Oct. 22, 1991

[54] TEMPERATURE COMPENSATION MEMBER COMPOSED OF SHAPE MEMORY EFFECT ALLOY FOR AN ACTUATOR DRIVEN BY A PIEZO-ELECTRIC ELEMENT

[75] Inventors: Manabu Yoshimura, Nagoya; Chihiro Yonekura, Okazaki, both of Japan

[73] Assignee: Brother Kogyo Kabushiki Kaisha, Aichi, Japan

[21] Appl. No.: 479,250

[22] Filed: Feb. 13, 1990

[30] Foreign Application Priority Data

Feb. 14, 1989 [JP] Japan .................................... 1-34258

[51] Int. Cl.⁵ ............................................ H01L 41/00
[52] U.S. Cl. ...................................... 310/328; 310/346
[58] Field of Search ................................. 310/328, 346

[56] References Cited

U.S. PATENT DOCUMENTS

| | | | |
|---|---|---|---|
| 3,673,442 | 6/1972 | Sonderegger | 310/346 |
| 4,345,176 | 8/1982 | Grudkowski et al. | 310/346 |
| 4,356,478 | 10/1982 | Muggli et al. | 337/140 |
| 4,551,647 | 11/1985 | Day | 310/346 |
| 4,570,098 | 2/1986 | Tomita et al. | 310/328 |
| 4,716,731 | 1/1988 | Sakai et al. | 337/139 |

FOREIGN PATENT DOCUMENTS

| | | | |
|---|---|---|---|
| 58-175811 | 10/1983 | Japan . | |
| 0237868 | 11/1985 | Japan | 310/328 |
| 0058883 | 3/1987 | Japan | 310/328 |
| 64-21975 | 1/1989 | Japan . | |
| 1392518 | 5/1985 | United Kingdom | 310/346 |

*Primary Examiner*—Mark O. Budd
*Assistant Examiner*—Thomas M. Dougherty
*Attorney, Agent, or Firm*—Oliff & Berridge

[57] ABSTRACT

An actuator driven by a piezo-electric element in this invention is provided with a piezo-electric element whose negative linear expansion caused by the change of circumjacent temperature is compensated for by positive linear expansion of a temperature compensation member. Since shape memory effect alloy is used for the temperature compensation member, the length of the temperature compensation member can be greatly shortened, and the actuator can be small-sized, light weight and improved in its heat conduction. Also, shape memory effect alloy can be used for temperature compensation members in broader range of temperature by stacking several pieces of the shape memory effect alloy whose transformation temperatures differ from each other.

5 Claims, 3 Drawing Sheets

TEMPERATURE COMPENSATION MEMBER COMPOSED OF SHAPE MEMORY EFFECT ALLOY FOR AN ACTUATOR DRIVEN BY A PIEZO-ELECTRIC ELEMENT

BACKGROUND OF THE INVENTION

This invention relates to an actuator, driven by a piezo-electric element that expands and contradicts when subjected to a voltage, having a temperature compensation element with a shape memory effect alloy to compensate for the effects of temperature on the expansion of the piezo-electric element.

Currently, some actuators are driven by piezo-electric elements which are connected to a frame at one end and to a movable member at the other end. In such actuators, the expansion and the contraction of the piezo-electric element moves a movable member in an expanding and contracting direction of the piezo-electric element. The movable member can thus be used to advance and retract members such as printing wires through transmissional facilities.

The piezo-electric element used in the above-mentioned actuators generally consists of laminated piezo-electric ceramics that linearly expand in the longitudinal direction of expansion and contraction.

However, negative longitudinal linear expansion of the piezo-electric element caused by changing circumjacent temperature effects the degree of the expansion and contraction of the piezo-electric element and consequently effects the degree of the motion of the movable member.

In order to compensate for the negative linear expansion of the piezo-electric element, a temperature compensation member 6 with a positive linear expansion is inserted between one end of a piezo-electric element 5 and a frame 1, as shown in FIG. 5.

The length L of the temperature compensation member 6 sufficient to compensate for the negative linear expansion of the piezo-electric element 5 is calculated by the following equation;

$$11.7 \times 10^{-6} \times L - 6.0 \times 10^{-6} \times 18 = 1.2 \times 10^{-6} \times (L+18)$$

where the piezo-electric element 5 is 2 mm long, 3 mm broad and 18 mm high and composed of laminated piezo-electric ceramics whose negative longitudinal linear thermal expansion coefficient is $-6.0 \times 10^{-6}/°C.$, the frame 1 consists of invar alloy whose linear thermal expansion coefficient at composition 36Ni-Fe is $1.2 \times 10^{-6}/°C.$, and the temperature compensation member 6 consists of SUS alloy whose linear thermal expansion coefficient is $11.7 \times 10^{-6}/°C$. The calculated length L of the temperature compensation member 6 according to the equation is approximately 12.34 mm. Thus, the actuator must be large enough to accommodate the length L of the temperature compensation member 6, and its weight is accordingly heavy. Moreover, the heat generated by the piezo-electric element 5 cannot be conducted to the temperature compensation element 6 quickly enough precisely to compensate for temperature variations.

SUMMARY OF THE INVENTION

The object of this invention is thus to provide a temperature compensation member whose length is sufficient to compensate for the negative linear expansion of the piezo-electric member but is as short as possible.

This object is attained by an actuator driven by a piezo-electric element comprising; a piezo-electric element that expands when subjected to a voltage; a frame attached to the piezo-electric element; a movable member attached to the piezo-electric element such that the movable member moves relative to the frame when the piezo-electric element expands; and a temperature compensation member comprising a plurality of layers of shape memory effect alloy having predetermined thermal expansion coefficients and different transformation temperatures, where the temperature compensation member is attached to the piezo-electric element to eliminate movement of the movable member relative to the frame caused by thermal expansion of the piezo-electric element. Additionally, the thermal expansion coefficients and transformation temperatures of the layers of shape memory effect alloy are such that the overall thermal expansion characteristic of the temperature compensation member is substantially linear.

By using the above-mentioned actuator, the amount of negative linear expansion of the piezo-electric element caused by the change of circumjacent temperature is compensated for by the positive linear expansion of the expansion member. Especially, the linear thermal expansion coefficient increases tenfold and more since the temperature compensation member is composed of several stacked pieces of shape memory effect alloy whose transformation temperatures differ from each other. Therefore, the length of the temperature compensation member can be shortened as much as possible, and the actuator can be small-sized and light weight. Also, thermal conductivity through the piezo-electric element can be improved.

DETAILED DESCRIPTION OF THE PREFERRED EMBODIMENT

Set forth is an explanation of an embodiment of the present invention with reference to the attached drawings FIG. 1 through FIG. 4.

Figure 1:
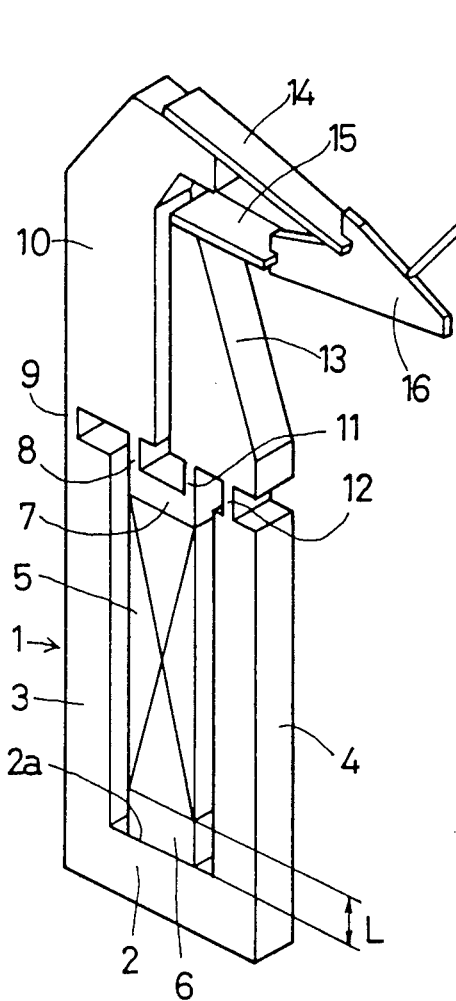
FIG. 1 is a perspective view of an actuator driven by a piezo-electric element.
Figure 2:
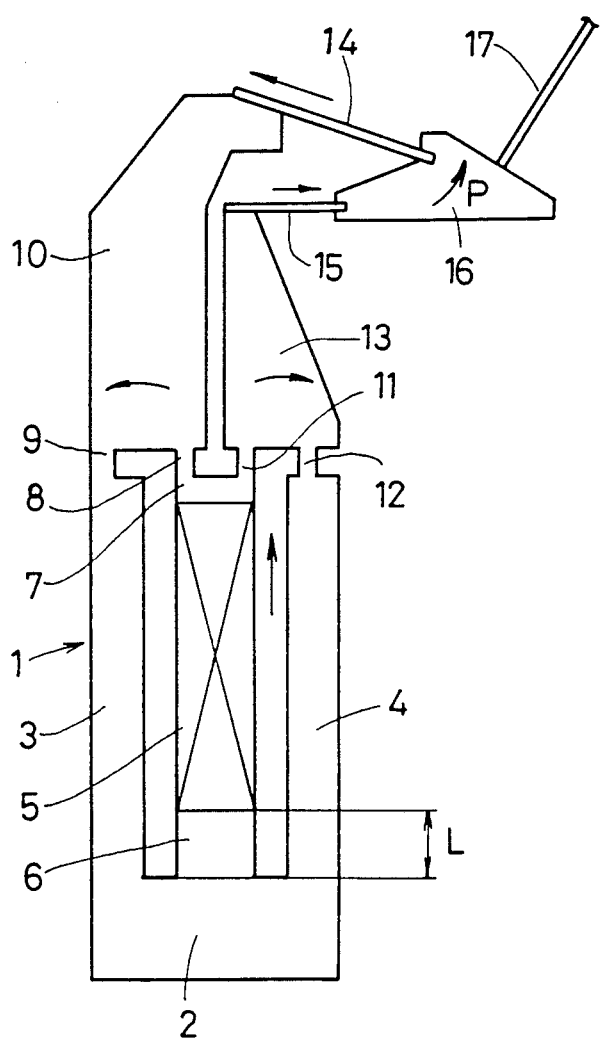
FIG. 2 is a lateral view of an actuator driven by a piezo-electric element.

In FIG. 1, a frame 1 made from a thick metal plate is mainly composed of a main stand 2 and first and second supporting members 3 and 4 at the both ends of the main stand 2, respectively. The frame 1 is generally U-shaped.

A known piezo-electric element 5 is a laminated ceramic piezo-electric device that expands and contracts in the longitudinal direction when subjected to a voltage. The bottom end of piezo-electric element 5 is supported on a supporting side 2a of the main stand member 2. A temperature compensation member 6 is mounted between the piezo-electric member 5 and the supporting side 2a and the main stand member 2.

An interlocking element 7 is fixed to the top end of piezo-electric member 5 with adhesive bond or the like.

A first tilting member 10 is formed between the top of the first supporting member 3 of the frame 1 and the top of interlocking element 7 such that it tilts about hinge 8 and hinge 9. Similarly, the second tilting member 13 is formed between the top of the interlocking element 7 and the top of the second supporting member 4 of the frame 1 such that it tilts about hinge 11 and hinge 12. Hinges 8, 9, 11, and 12 have the characteristic of elastic deformation.

The bottoms of flat springs 14 and 15 are fixed to the tops of the first tilting member 10 and the second tilting member 13, respectively. A wire supporting arm 16 that has a printing wire 17 fixed thereto is connected to the ends of the flat springs 14 and 15.

When the piezo-electric member 5 expands while being subjected to a voltage, the first tilting member 10 and the second tilting member 13 tilt outward, with fulcrums being hinge 9 and hinge 12, respectively. Consequently, the first tilting member 10 pulls the flat spring 14, and the second tilting member 13 pushes the flat springs 15 in the direction arrow P in FIG. 2, and the printing wire 17 advances to the place of printing by a guidance member 18.

Figure 3:
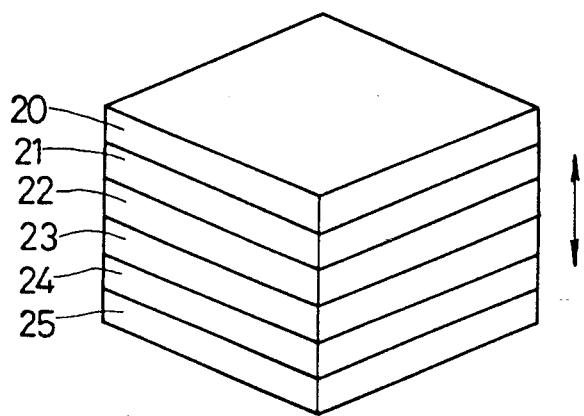
FIG. 3 is a perspective view of a temperature compensation member composed of shape memory effect alloy.
Figure 4:
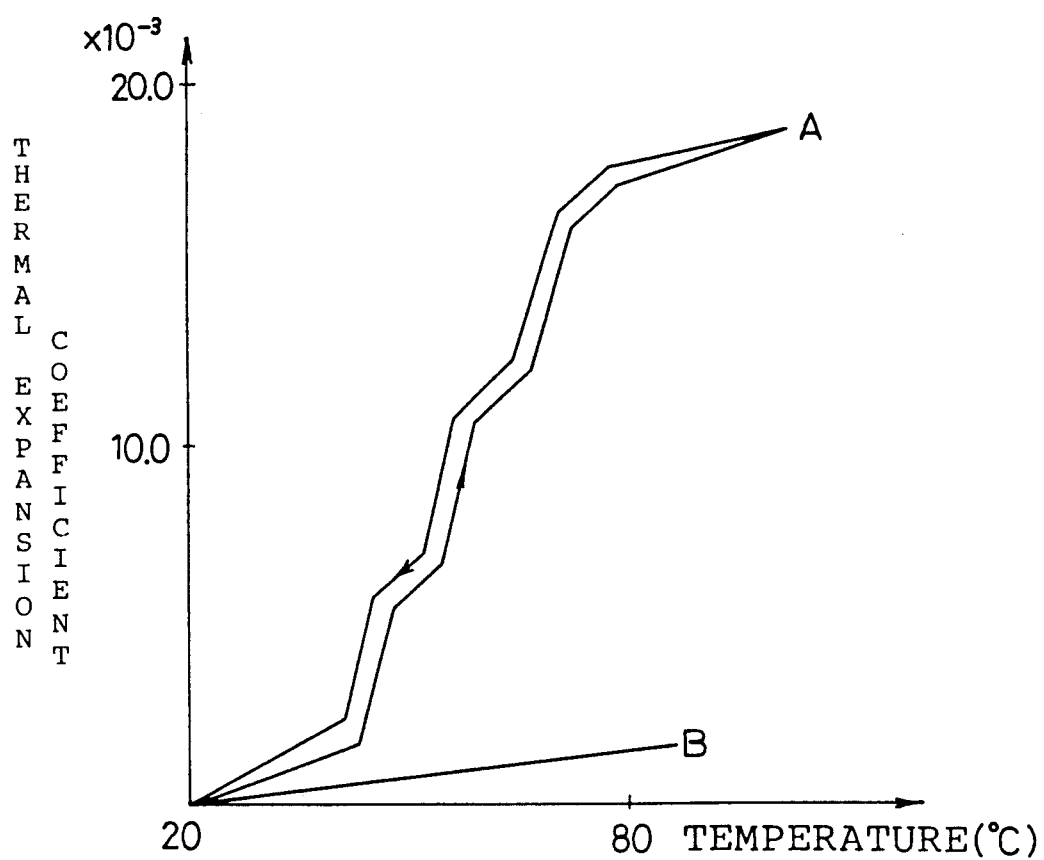
FIG. 4A is a diagram which represents the change of the form of stacked pieces of shape memory effect alloy.
FIG. 4B is a diagram which represents the change of the form of SUS alloy in related art.
Figure 5:
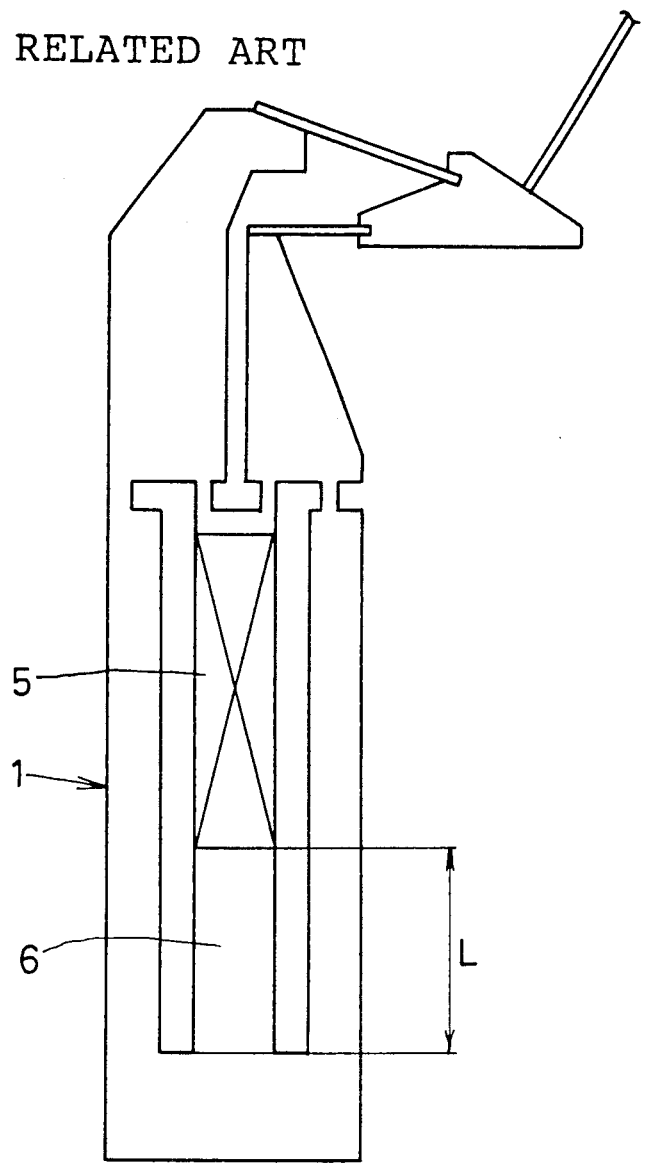
FIG. 5 is a lateral view of an actuator driven by a piezo-electric element in the related art.

The temperature compensation member 6 which is inserted between the piezo-electric element 5 and the main stand member 2 of the frame 1 is composed of several pieces of shape memory effect alloy 20 through 25 (Ti-Ni alloy) whose transformation temperatures differ from each other by approximately 10° C., as shown in FIG. 3. (Ti-50 at % Ni alloy changes its transformation temperature by approximately 10° C. when the amount of Ni changes by approximately 0.1 at %.) The method of making these shape memory effect alloy 20 through 25 is now described. First, the alloy is heat treated at 500° C. for 30 minutes in a vacuum and then quenched with water. Next, 3% of transformation is given to the alloy in the expanding and contracting direction of displacement (the direction of an arrow in FIG. 3) to let the alloy have the characteristic of reversible shape memory effect. Finally, the alloy is restored to the original state by applying to the alloy higher heat than the transformation temperature. After repeating these actions from thirty to forty times, the shape memory effect alloy 20 through 25 come to have the characteristic of reversible shape memory effect of approximately 0.2% of each height according to the change of temperature in the direction of displacement. If the temperature compensation member 6 is composed of stacked shape memory effect alloy 20 through 25 made by the above-mentioned method, the temperature compensation member 6 linearly expands, as shown in FIG. 4A between 20° C. and 80° C. The thermal expansion coefficient of the temperature compensation member 6 is much higher than the thermal expansion coefficient of SUS alloy in the related art (FIG. 4B).

If shape memory effect alloys 20 through 25 are used for the temperature compensation member 6, the linear thermal expansion coefficient is $200 \times 10^{-6}/°C$. between 20° C. and 80° C., where the piezo-electric element 5 is 2 mm long, 3 mm broad and 18 mm high and composed of laminated piezo-electric ceramics whose negative longitudinal linear thermal expansion coefficient is $-6.0 \times 10^{-6}/°C$., and the frame 1 is composed of invar alloy whose linear thermal expansion coefficient is $1.2 \times 10^{-6}/°C$. at composition 36 Ni-Fe.

Therefore, the length L of the temperature compensation member 6 of this embodiment sufficient to compensate for the amount of negative linear expansion of piezo-electric element 5 is calculated by the following equation;

$$200 \times 10^{-6} \times L - 6.0 \times 10^{-6} \times 18$$
$$= 1.2 \times 10^{-6} \times (L + 18)$$

The calculated length L of the temperature compensation member 6 is approximately 0.7 mm.

If the temperature compensation member 6 is composed of SUS alloy whose linear thermal expansion coefficient is $11.7 \times 10^{-6}°C$., the length L of the temperature compensation member 6 is approximately 12.34 mm. Thus, the length L of the temperature compensation member 6 of this embodiment which is approximately 0.7 mm is about one eighteenth of the length L of the temperature compensation member 6 composed of SUS alloy. Therefore, the actuator can be small-sized, light weight and can precisely compensate temperature by conducting head generated by the piezo-electric element 5 to the temperature compensation member 6 quickly.

A printing head of a printing equipment is described using the example of an actuator driven by a piezo-electric element in this embodiment. However, shape memory effect alloy can be also used for temperature compensation members of other kinds of actuators driven by piezo-electric elements.

Additionally, the stacked shape memory effect alloy can be used for various kinds of temperature compensation members taking advantage of the characteristics of expanding linearly.

What is claimed is:

1. An actuator driven by a piezo-electric element, comprising:
   a piezo-electric element that expands when subjected to a voltage;
   a frame attached to the piezo-electric element;
   a movable member attached to the piezo-electric element such that the movable member moves relative to the frame when the piezo-electric element expands; and
   a temperature compensation member comprising a plurality of layers of shape memory effect alloy having substantially same predetermined thermal expansion coefficients and different transformation temperatures, where the temperature compensation member is attached to the piezo-electric element to eliminate movement of the movable member relative to the frame caused by thermal contraction of the piezo-electric element.

2. The actuator of claim 1, wherein the thermal expansion coefficients and transformation temperatures of the layers of shape memory effect alloy are such that the overall thermal expansion characteristic of the temperature compensation member is substantially linear.

3. The actuator of claim 1, wherein the layers of shape memory effect alloy are titanium-nickel alloy.

4. The actuator of claim 3, wherein the layers of shape memory effect alloy have transformation temperatures that differ from each other by 10° C.

5. The actuator of claim 1, wherein the temperature compensation member is attached to the piezo-electric element between the piezo-electric element and the frame.

* * * * *